United States Patent
Park et al.

[11] Patent Number: 6,025,205
[45] Date of Patent: Feb. 15, 2000

[54] APPARATUS AND METHODS OF FORMING PREFERRED ORIENTATION-CONTROLLED PLATINUM FILMS USING NITROGEN

[75] Inventors: Dong Yeon Park; Dong Su Lee, both of Seoul; Hyun Jung Woo, Sungnam Kyunggi-Do; Dong Il Chun; Eui Joon Yoon, both of Seoul, all of Rep. of Korea

[73] Assignee: Tong Yang Cement Corporation, Seoul, Rep. of Korea

[21] Appl. No.: 09/003,059

[22] Filed: Jan. 5, 1998

[51] Int. Cl.⁷ ........................................... H01L 1/28
[52] U.S. Cl. .................. 438/3; 438/658; 438/660; 438/666; 438/686
[58] Field of Search ..................... 438/650, 686, 438/658, 660, 666, 3; 204/192.1, 192.17

[56] References Cited

U.S. PATENT DOCUMENTS

| | | | |
|---|---|---|---|
| 3,642,548 | 2/1972 | Eger | 156/3 |
| 4,028,657 | 6/1977 | Reichelt | 338/307 |
| 4,103,275 | 7/1978 | Diehl et al. | 338/25 |
| 4,129,848 | 12/1978 | Frank et al. | 338/308 |
| 4,253,931 | 3/1981 | Gold et al. | 204/192 |
| 4,375,056 | 2/1983 | Baxter et al. | 338/25 |
| 4,396,899 | 8/1983 | Ohno | 338/34 |
| 4,690,861 | 9/1987 | Nakamura et al. | 428/623 |
| 4,804,438 | 2/1989 | Rhodes | 156/653 |
| 4,952,904 | 8/1990 | Johnson et al. | 338/36 |
| 4,966,865 | 10/1990 | Welch et al. | 437/192 |
| 5,104,684 | 4/1992 | Tao et al. | 427/38 |
| 5,142,437 | 8/1992 | Kammerdiner et al. | 361/313 |
| 5,191,510 | 3/1993 | Huffman | 361/313 |
| 5,320,978 | 6/1994 | Hsu | 437/192 |
| 5,331,187 | 7/1994 | Ogawa | 257/295 |
| 5,348,894 | 9/1994 | Gnade et al. | 437/12 |
| 5,440,173 | 8/1995 | Evans, Jr. et al. | 257/751 |
| 5,453,294 | 9/1995 | Ogi et al. | 427/100 |
| 5,471,072 | 11/1995 | Papanicolaou | 257/77 |
| 5,498,569 | 3/1996 | Eastep | 437/187 |
| 5,508,953 | 4/1996 | Fukuda et al. | 365/145 |
| 5,512,151 | 4/1996 | Hayamizu et al. | 204/192.15 |
| 5,514,484 | 5/1996 | Nashimato | 428/700 |
| 5,650,202 | 7/1997 | Mammone et al. | 427/536 |
| 5,656,382 | 8/1997 | Nashimoto | 428/620 |
| 5,736,422 | 4/1998 | Lee et al. | 438/201 |
| 5,776,621 | 7/1998 | Nashimoto | 428/688 |
| 5,793,057 | 8/1998 | Summerfelt | 257/55 |
| 5,840,615 | 11/1998 | Aoki et al. | 438/396 |
| 5,846,859 | 12/1998 | Lee | 438/253 |

OTHER PUBLICATIONS

M. Hecq and A. Hecq, "Oxygen Induced Preferred Orientation of DC Sputtered Platinum," *J. Vac. Sci. Technol.*, vol. 18, No. 2, Mar. 1981, pp. 219–222.

R.C. Budhani et al., "Summary Abstract: Oxygen Enhanced Adhesion of Platinum Films Deposited on Thermally Grown Alumina Surfaces," *J. Vac. Sci. Technol. A*, vol. 4, No. 6, Nov./Dec. 1986,, pp. 3023–3024.

K.H. Park, et al., "Microstructures and Interdiffusions of Pt/Ti Electrodes With Respect To Annealing in the Oxygen Ambient," *J. Mater. Res.*, vol. 10, No. 7, Jul. 1995, pp. 1790–1794.

(List continued on next page.)

*Primary Examiner*—Wael Fahmy
*Assistant Examiner*—Kurt Eaton
*Attorney, Agent, or Firm*—Townsend & Townsend & Crew LLP

[57] ABSTRACT

Platinum film orientation-controlled to (111), (200) and/or (220) are provided by depositing the platinum film under an atmosphere containing nitrogen as well as an inert gas (Ar, Ne, Kr, Xe) on a substrate heated to temperature ranged from room temperature to 500° C., and then annealing to substantially remove nitrogen introduced into the platinum film during the deposition thereof. The platinum film formed in this process has an excellent electrical conductivity (resistivity is lower than 15 $\mu\Omega$-cm), good enough adhesion strength to be used for electronic devices, and does not show hillocks, pores or pinholes.

21 Claims, 9 Drawing Sheets

OTHER PUBLICATIONS

G. Cui et al, "Epitaxial Growth of Pt(001) Thin Films on MgO(001) Under Oxidizing Conditions," *Mat. Res. Soc. Symp. Proc.*, vol. 310, 1993, pp. 345–350, No month.

K. Kushida–Abdelghafar, "Pt/TiN Electrodes for Stacked Memory With Polysilicon Plug Utilizing PZT Films," *Integrated Ferroelectrics*, vol. 13, 1996, pp. 113–119, No month.

D.E. Kotecki, "High–K Dielectric Materials for DRAM Capacitors," *Semiconductor International*, Nov. 1996, pp. 109–110 and 112, 114 and 116.

D.S. Lee et al., "Characterization of Platinum Films Deposited By a Two–Step Magnetron Sputtering on $SiO_2$/SI Substrates," (Oct. 8, 1997 printout from http://www.tycl.co.kr/eng/mrs2.htm) from Materials Research Society Fall Meeting 1996 in Boston, Massachusetts, Nov. 8, 1996, 6 pages.

M.H. Kim et al., "Stress of Platinum Films Deposited By DC Magnetron Sputtering Using Argon/Oxygen Gas Mixture," (Oct. 8, 1997 printout from http://www.tycl.co.kr/eng/mrs2.htm) from Materials Research Society Fall Meeting 1996 in Boston, Massachusetts, Nov. 8, 1996, 5 pages.

D.Y. Park et al., "(100) Orientation Platinum Thin Films Deposited By DC Magnetron Sputtering on $SiO_2$/Si Substrates," (Oct. 8, 1997 printout from http://www.tycl.co.kr/eng/mrs2.htm) from Materials Research Society Fall Meeting 1996 in Boston, Massachusetts, Nov. 8, 1996, 5 pages.

K. Sreenivas et al., "Investigation of Pt/Ti Bilayer Metallization on Silicon for Ferroelectric Thin Film Integration," *J. Appl. Phys.*, vol. 75, No. 1, Jan. 1994, pp. 232–239.

B.S. Kwak et al., "Study of Epitaxial Platinum Films Grown by Metalorganic Chemical Vapor Deposition," *J. Appl. Phys.*, vol. 72, No. 8, 1992, pp. 3735–3740, No month.

Staley, John, "Platinum Thin Films and Next–Generation Micromachined Sensors," *Sensors*, Apr. 1996, pp. 56–62.

H.N. Al–Shareef et al., "Electrodes for Ferroelectric Thin Films," *Integrated Ferroelectrics*, vol. 3, 1993, pp. 321–332, No month.

P.D. Hren et al., "Bottom Electrodes for Integrated Pb(Zr, Ti)$O_3$ Films," *Integrated Ferroelectrics*, vol. 2, 1992, pp. 311–325, No month.

G.A.C.M. Spierings et al., "Influence of Platinum–Based Electrodes on the Microstructure of Sol–Gel and MOD Prepared Lead Zirconate Titanate Films," *Integrated Ferroelectrics*, vol. 3, 1993, pp. 283–292, No month.

G.A.C.M. Spierings et al., "Stresses in Pt/Pb(Zr,Ti)O3/Pt Thin–Film Stacks for Integrated Ferroelectric Capacitors," *J. Appl. Phys.*, vol. 78, No. 3, 1995, pp. 1926–1933, No month.

D.H. Lee et al., "Microstructures and Pyroelectric Properties of (Pb,La)$TiO_3$ Thin Films Grown on MgO and on Pt/MgO," *Integrated Ferroelectrics*, vol. 5, 1995, pp. 125–132, No month.

Hitoshi Tabata et al., "C–axis Preferred Orientation of Laser Ablated Epitaxial $PbTiO_3$ Films and Their Electrical Properties," *Appl. Phys. Lett.*, vol. 64, No. 4, 1994, pp. 428–430, No month.

P.C. McIntyre et al., "Orientation Selection and Microstructural Evolution of Epitaxial Pt Films on (001) MgO," *Mat. Res. Soc. Symp. Proc.*, vol. 355, 1995, Symposium held Nov. 28–Dec. 2, 1994 in Boston, Massachusetts, pp. 335–340.

R. Ramesh et al., "Oriented Ferroelectric La–Sr–Co–O/Pb–La–Zr–TiO/La–Sr–Co–O Heterostructures on (001) Pt/$SiO_2$ Si Substrates Using a Bismuth Titanate Template Layer," *Appl. Phys. Lett.*, vol. 64, No. 19, 1994, pp. 2511–2513, No month.

R. Moazzami, "Ferroelectric Thin Film Technology for Semiconductor Memory," *Semicond. Sci. Technol.*, vol. 10, 1995, pp. 375–390, No month.

M. Otsu et al., "Preparation of PZT Film on (100)Pt/(100)MgO Substrate by CVD and its Properties," *J. Ceram. Japan*, vol. 102, No. 2, 1994, pp. 126–132, No month.

B.A. Tuttle et al., "Highly Oriented, Chemically Prepared Pb(Zr,Ti)$O_3$ Thin Films," *J. Am. Ceram. Soc.*, vol. 76, No. 6, 1995, pp. 1537–1544, No Month.

APPARATUS AND METHODS OF FORMING PREFERRED ORIENTATION-CONTROLLED PLATINUM FILMS USING NITROGEN

CROSS-REFERENCE TO RELATED APPLICATIONS

This application claims priority from commonly-assigned Republic of Korea Application Serial No. P97-159 (filed Jan. 7, 1997) and No. P97-17210 (filed May 6, 1997).

BACKGROUND OF THE INVENTION

The present invention relates to a technique for depositing a platinum film, which is used as a bottom electrode for capacitors of dynamic random access memory (DRAM) cells or of non-volatile memory cells and film sensors. More particularly, the invention relates to a technique for controlling the preferred orientation of the platinum films by depositing the platinum under an atmosphere containing nitrogen as well as an inert gas and then annealing to remove the nitrogen which was introduced during the deposition of the platinum. The present invention also relates to a method of manufacturing semiconductor devices or sensor devices comprising such platinum thin films.

In order to increase the capacitance of a DRAM cell capacitor to meet the requirements of increasingly high integration of semiconductor memory devices, several approaches (e.g., (i) decreasing the thickness of dielectric material films, (ii) increasing the effective area of the capacitor, and (iii) using materials with high dielectric constant as dielectric oxide films) have been proposed. However, decreasing the thickness of a dielectric material film to less than 100 Å deteriorates reliability of the semiconductor device due to the Fowler-Nordheim current. Increasing the effective area is complicated in its process and incurs high manufacturing cost. Moreover, deposited layers are not uniform and leakage current is generated between the trenches when applied to a laminate-type capacitor and a trench type capacitor, respectively. Thus, these two conventional methods have limitations especially when applied to high density memory cells of higher than 1 Gbit. The third proposed method to use high-ielectric materials is currently being investigated to form capacitors of DRAM cells, which have conventionally used polysilicon as the bottom electrode material. However, such high-dielectric oxide films need to be formed under an oxidation atmosphere and high temperature (higher than 500° C.), which may result in problems relating to the polysilicon. For example, if polysilicon is employed as the bottom electrode in using high-dielectric materials as a capacitors, serious problems may occur due to oxidation of the polysilicon under the high temperature (over 500° C.) and oxidation atmosphere during formation of the highdielectric oxide thin films. For this reason, platinum is being investigated for use in place of polysilicon as an electrode of a DRAM cell employing a high-dielectric oxide, because platinum is stable under high temperature and oxidation atmosphere.

Moreover, it is well known that the properties of anisotropic crystals depend on their crystallographic orientations. The crystallographic orientations of oxide films formed on bottom electrodes depend on the crystallographic orientation of the bottom electrodes. Therefore, it is believed that controlling the preferred orientation of bottom electrodes is very important in controlling the preferred orientation of oxide fils in order to have films with desirable physical properties.

High-dielectric/ferroelectric materials are used for not only DRAM cells but also other electronic devices such as non-volatile ferroelectric memory devices, ferroelectric sensors or actuator devices, etc. Platinum is most favored, in particular, as a bottom electrode of such high-dielectric/ferroelectric devices. The favored high-dielectric and ferroelectric materials are oxides having perovskite structure, bismuth-layered perovskite structure and tungsten-bronze type structure along with $ReMnO_3$ (Re: rare earth element) and $BaMF_4$ (M: Mn, Co, Ni, Mg, Zn).

It is known that a platinum thin film, which is deposited on an insulating oxide layer by the conventional method, generally has a preferred (111) orientation. This is due to the fact that the plane with the minimum surface energy in metals with face centered cubic (FCC) structure is (111) and, considering only the surface energy at the depositing, the film is most stable if oriented toward (111).

Conventional methods for forming preferred orientation-controlled platinum films which have been suggested have limitations. In order to change the preferred orientation of the platinum film, one such conventional method that has been suggested is forming the platinum film on a single crystal substrate of the materials such as MgO, NaCl, KBr, $SrTiO_3$, LaAlO3. However, such a method not only is complicated in its process and incurs high unit costs for single-crystalline substrates but also is incompatible with the state-of-the art in manufacturing silicon-integrated circuits. Other conventional methods have formed orientation-controlled platinum by depositing platinum on a glass substrate not on a silicon wafer, or by using a specially designed sputtering equipment which has an "auxiliary electrode" in order to deposit platinum film on silicon substrates. However, it has been reported that orientation-controlled platinum films deposited on glassy substrates have high resistivity (18 to 30 $\mu\Omega$-cm) since oxygen, which was introduced during the deposition thereof, has remained within the platinum films even after annealing for 10 days. Therefore, it has been thought to be difficult and impractical to apply this process to real manufacturing practices, due to the very long annealing time. Furthermore, the platinum films formed on a silicon wafer by the conventional methods using sputtering are not dense enough and may have a number of pinholes, pores or hillocks, which may result in device performance problems.

The aforementioned drawbacks have been resolved by the inventions disclosed in Korean Patent Application No. 94-31618 filed on Nov. 26, 1994 and No. 95-40450 filed on Nov. 8, 1995 (corresponding U.S. application Ser. No. 08/562,371, filed Nov. 22, 1995) and No. 96-7663 filed on Mar. 21, 1996 (corresponding U.S. application Ser. No. 08/688,521, filed Jul. 30, 1996) by the present applicants' technology of depositing a platinum film on a silicon wafer under an atmosphere containing oxygen having preferred (200) orientation. According to these inventions, platinum thin films deposited on a silicon wafer with an insulating oxide layer have good adhesion strength and preferred (200) orientation.

It is seen from the above that alternative and improved methods for forming preferred orientation-controlled platinum films onto silicon substrates as well as other substrates are needed. It is desirable that such methods be compatible with silicon-integrated circuit technology in some applications. It is also desirable that such preferred orientation-controlled platinum films having minimized pinholes, pores or hillocks in order to provide improved device performance.

SUMMARY OF THE INVENTION

The present invention provides a method of manufacturing an orientation-controlled platinum film and a platinum film formed thereby, according to specific embodiments. In accordance with other specific embodiments, the present invention also provides a method of manufacturing an electronic device comprising an orientation-controlled platinum fil and an electronic device manufactured thereby. In particular, the present invention provides a method of freely controlling a preferred orientation of a platinum film by depositing a platinum film under an atmosphere containing nitrogen, and then annealing so that the orientation of the platinum film becomes (111), (200) and/or (220).

According to a specific embodiment, the present invention provides a method of forming a platinum film on a substrate comprising the steps of depositing a platinum on the substrate under an atmosphere containing nitrogen together with an inert gas to deposit a platinum film containing a nitrogen component; and annealing the platinum film containing the nitrogen component to substantially remove the nitrogen component from the platinum film, whereby orientation of the platinum film can be controlled by changing at least one of the following parameters: the partial pressure ratio of the nitrogen to the entire total depositing atmosphere gas, the temperature of the substrate and the annealing conditions. The platinum film can be formed through two or more deposition steps, according to specific embodiments.

In accordance with the present invention, the platinum film may be deposited by employing any one of the following methods: the direct current or radio frequency (DC/RF) magnetron sputtering, DC/RF sputtering, metal organic chemical vapor deposition, partially ionized beam deposition, vacuum evaporation, laser ablation and electroplating.

In other embodiments, the method forming a platinum film described above can be applied to a process manufacturing an electronic device by forming a high-dielectric or ferroelectric oxide film on the platinum film. In this case, for example, the platinum film functions as a bottom electrode. Depending on types of electronic devices to which the film is applied, a functional intermediate film (such as an insulation layer, a conductive plug, an adhesion layer, or a diffusion barrier layer) may be provided between the platinum film and the substrate, according to various specific embodiments. In accordance with other specific embodiments, the present invention provides an electronic device with preferable characteristics which are required for DRAM or non-volatile memory devices.

The present invention along with its features and advantages will now be explained in detail with reference to the attached drawings illustrating preferred embodiments of the present invention.

DETAILED DESCRIPTION OF THE SPECIFIC EMBODIMENTS

Figure 1A:
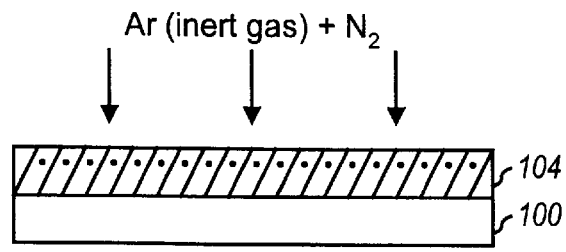
FIGS. 1a to 1c are cross-sectional views illustrating the steps of manufacturing an electronic device comprising a platinum thin film formed according to a specific embodiment of the present invention.

The present invention provides a method of manufacturing an orientation-controlled platinum film and a platinum film formed thereby, according to specific embodiments. In accordance with other specific embodiments, the present invention also provides a method of manufacturing an electronic device comprising an orientation-controlled platinum film and an electronic device manufactured thereby. Various specific embodiments of the present invention provide methods of freely controlling a preferred orientation of a platinum film by depositing a platinum film under an atmosphere containing nitrogen, and then annealing so that the orientation of the platinum film becomes (111), (200) and/or (220).

In particular, various specific embodiments of the present invention are generally described below in relation to FIGS. 1a to 1c, FIG. 2, FIGS. 3a to 3d, and FIG. 4. In these specific embodiments, the present invention provides for a preferred orientation-controlled platinum film that is formed over a substrate. According to specific embodiments, the present invention deposits a platinum film on a substrate under an atmosphere containing nitrogen together with an inert gas to deposit a platinum film containing nitrogen; and anneals the platinum film containing nitrogen components to remove nitrogen components from the platinum film, whereby orientation of the platinum film can be controlled by changing at least one of the following parameters: the partial pressure ratio of the nitrogen to the entire total depositing atmosphere gas, the temperature of the substrate and the annealing conditions. An inert gas can be selected from Ar, Ne, Kr or Xe, in accordance with specific embodiments. The present invention can be applied to a process manufacturing an electronic device. In some embodiments, a ferroelectric film may be formed on the platinum film, with the platinum film functioning, for example, as a bottom electrode. In some specific embodiments, depending on types of electronic devices to which the platinum film is applied, a functional intermediate film (such as an insulation layer, a conductive plug, an adhesion layer, or a diffusion barrier layer) may be provided between the platinum film and the substrate. Various materials which may be used for the different films are discussed in detail below and have general applicability to the following description of the specific embodiments.

The material of the substrate may be selected from one of the following groups: single component semiconductor materials, e.g., silicon (Si), germanium (Ge) and diamond (C); compound semiconductor materials, e.g., GaAs, InP, SiGe and SiC; ceramic single crystals, e.g., $SrTiO_3$, $LaAlO_3$, $Al_2O_3$, KBr, NaCl, MgO, $ZrO_2$, $Si_3N_4$, $TiO_2$, $Ta_2O_5$, AlN or ceramic poly-rystals thereof; metals, e.g., Au, Ag, Al, Ir, Pt, Cu, Pd, Ru, W; and amorphous/glassy materials, e.g., BSG, PSG, BPSG, Si.

As mentioned above, a functional intermediate film such as an insulating layer, a conductive plug layer, a diffusion barrier layer, or an adhesive or glue layer can be interposed between the platinum film and the substrate. The materials used for a functional intermediate film functioning as an insulating layer include $SiO_2$, $Si_3N_4$, BPSG, MgO, CaO, $CaF_2$, $Al_2O_3$ or $B_2O_3$. The materials used for a functional intermediate film functioning as a conductive plug layer include TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, Cu and the like. The material used for a functional intermediate film which functions as a diffusion barrier layer can be selected from any one of the following groups: ternary component amorphous materials (Ti—Si—N, Ta—B—N, Ti—B—N), conductive nitride (titanium aluminum nitride, Zr nitride, Hf nitride, Y nitride, Se nitride, La nitride, rare earth nitride, N deficient Al nitride, doped Al nitride, Mg nitride, Ca nitride, Sr nitride, Ba nitride, TiN, GaN, Ni nitride, Ta nitride, Co nitride, W nitride, and the like. The materials used for a functional intermediate film used for an adhesion or glue layer include TiN, W, Ta, Ti, Sn, Ru, In, Ir, Os, Rh, and silicide compound (Ni silicide, Co silicide, W silicide).

In accordance with the present invention, the platinum film may be deposited by employing any one of the following methods: the DC/RF magnetron sputtering, DC/RF sputtering, metal organic chemical vapor deposition, partially ionized beam deposition, vacuum evaporation, laser ablation and electroplating.

A method manufacturing an electronic device comprising a platinum film according to the present invention includes a step of forming a high-dielectric/ferroelectric film on top surface of a platinum film after depositing the platinum film. For example, material used for the high-dielectric film or the ferroelectric film may be selected from any one of the following groups: a perovskite structure oxide, such as $BT(BaTiO_3)$, $BST(Ba_{1-x}Sr_xTiO_3)$, $ST(SrTiO_3)$, $PT(PbTiO_3)$, $PZT(Pb(Zr, Ti)O_3$, $PLT(Pb_{1-x}La_xTiO_3)$, PLZT $(x/y/zPb_{1-x}La_x)(ZyTiz)_{1-x/4}O_3$, $PMN(PbMg_{1/3}Nb_{2/3}O_3)$, $LiTaO_3$, $KNbO_3$, $K(Ta, Nb)O_3$, $CaTiO_3$, $SrSnO_3$, $NaNbO_3$, $LaAlO_3$, $YAlO_3$ and KMGF3; a bismuth-layered perovskite structure oxide, such as $SrBiNbO_9$, $SrBi_2Ti_2O_9$, $SrBi_2Ta_2O_9$, $SrBi_2(Ta_xNb_{1-x})_2O_9$ and $Bi_4Ti_3O_{12}$); a tungsten-bronze type structure oxide such as $Sr_{1-x}Ba_xNb_2O_6$, $(Sr, Ba)_{0.8}R_xNa_{04}Nb_2O_6$(R; Cr, Zn, Y), (Pb, Ba)$Nb_2O_6$, (K, Sr)$Nb_2O_6$, (Pb, K)$Nb_2O_6$), $Pb_2KNb_5O_{15}$, $K_3Li_2Nb_5O_{15}$, and (K, Na)$_3Li_2Nb_5O_{15}$, $K_2LiNb_5O_{15}$; $ReMnO_3$ (where Re is a rare-earth element); and $BaMF_4$ (where M is Mn, Co, Mg, or Zn).

Figure 1B:
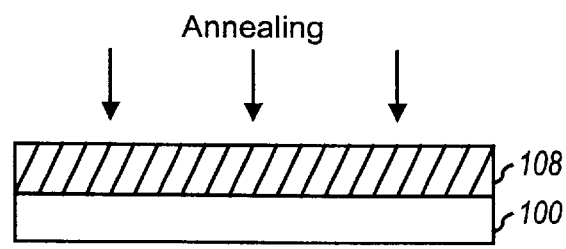
Figure 1C:
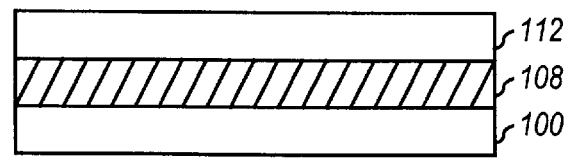

Specifically, FIGS. 1a to 1c are schematic cross-sectional views illustrating the steps of manufacturing an electronic device comprising a platinum film deposited according to one aspect of the present invention.

Referring to FIG. 1a, a platinum film 104 is deposited on top surface of the substrate 100. The depositing atmosphere contains an inert gas (Ar, Ne, Xe, Kr, etc.) and nitrogen component, and under the temperature range between room temperature and 500° C. Accordingly, a nitrogen component is contained in the platinum film 104. Referring to FIG. 1b, the platinum film 104 formed on the substrate 100 is annealed under the temperature range between 400° C. and 1,000° C. to remove the nitrogen component from the platinum film 104. This process converts the platinum film 104 into the platinum film 108 which is substantially free from nitrogen components. The platinum film 108 has a high-dielectric/ferroelectric oxide film 112 thereon, as shown FIG. 1c, so that it can be used as a bottom electrode in DRAM cells or non-volatile high-dielectric/ferroelectric memory cells or sensor devices. Though not illustrated in the drawings, electronic devices such as capacitors can be manufactured by forming an top electrode comprising the material identical with that of the bottom electrode, i.e., platinum or other conductive material.

For the embodiment of FIGS. 1a to 1c, preferred orientation of the platinum film formed according to the above method can be controlled by at least any one of the following parameters: the partial pressure ratio of the nitrogen component to the entire gas of the platinum film deposition atmosphere, deposition temperature of the substrate or annealing conditions. According to the present invention, even if any one of conductive plug and/or a diffusion barrier layer is used such as materials mentioned before, oxidation of those can be suppressed by control of annealing temperature, unlike in the case of depositing a platinum film under an atmosphere of oxygen as suggested in U.S. patent application Ser. Nos. 08/562,371 (Nov. 22, 1995) and 08/688,521 (Jul. 30, 1996).

Figure 2:
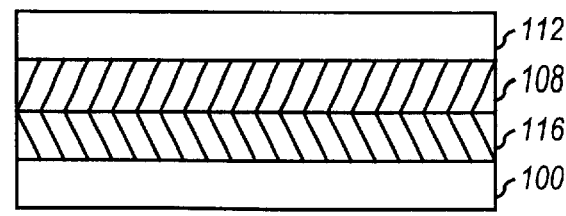
FIG. 2 is a cross-sectional view illustrating a modification to the method of FIGS. 1a to 1c, in which an insulation layer is deposited to electrically separate the substrate from the platinum film, in accordance with another specific embodiment of the present invention.

FIG. 2 is a block diagram illustrating a modification to the method of FIGS. 1a to 1c. Referring to FIG. 2, an insulating layer 116 such as SiO2 or $Si_3N_4$ is formed between the substrate 100 and the platinum film 108 to be formed on top surface of the substrate 100. The platinum film 108 formed on the insulating layer 116 is deposited under an atmosphere containing a nitrogen component together with an inert gas and then annealed as shown in FIG. 1a. In this embodiment, orientation of the platinum film can be controlled by changing at least one of the following parameters: the partial pressure ratio of the nitrogen component to the entire gas of the deposition atmosphere, depositing temperature of the substrate or annealing conditions.

Figure 3A:
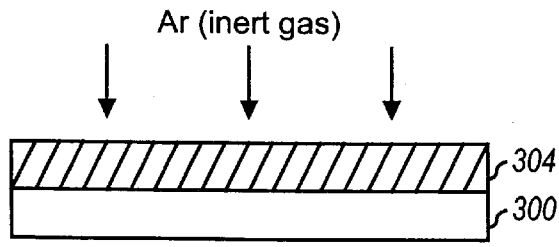
FIGS. 3a to 3d are cross-sectional views illustrating the steps of another modification to the method of FIGS. 1a to 1c, in accordance with yet another specific embodiment of the present invention.
Figure 3B:
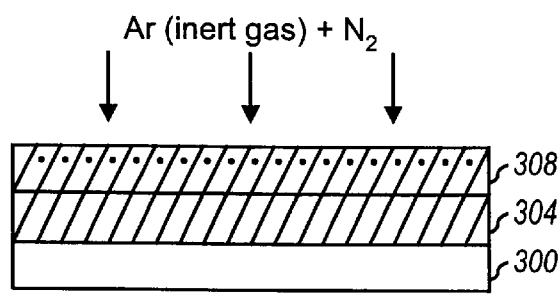
Figure 3C:
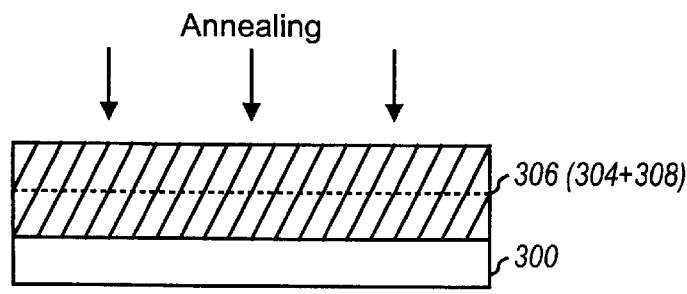
Figure 3D:
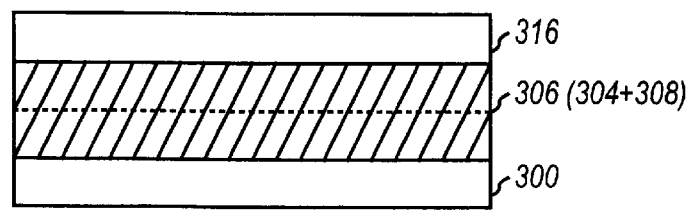

Alternatively, a platinum film can be deposited in two or more separate steps as shown in FIGS. 3a to 3d which show the steps manufacturing an electronic device comprising a platinum film deposited according to another aspect of the present invention. Referring to FIG. 3a, a first thickness part 304 of the platinum film is deposited on the top surface of a substrate 300 under an inert gas atmosphere. Following this, a second thickness part 308 of the platinum film is deposited on the top surface of the first thickness part 304 under atmosphere containing nitrogen together with an inert gas as shown in FIG. 3b. FIG. 3c shows an annealing process to remove the gases incorporated during sputtering of the second thickness part 308. This process converts the platinum films 304 and 308 to the platinum film 306 which is substantially free of nitrogen components. As shown in FIG. 3d, an electronic device such as a capacitor is produced by forming a high-dielectric/ferroelectric oxide film 316 on the top surface of the annealed platinum film 306(304+308) and forming a top electrode (not shown in FIG. 3d) made from the same material as that of the bottom electrode or other conductive material.

Figure 4:
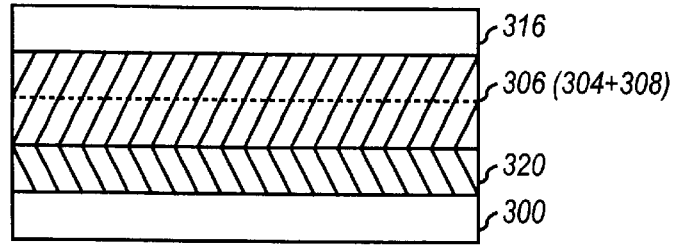
FIG. 4 is a cross-sectional view illustrating a modification to the method of FIGS. 3a to 3d, in which an insulation layer is interposed between the substrate and the platinum film, in accordance with still further another specific embodiment of the present invention.

FIG. 4 is a block diagram illustrating a modification to the method illustrated in FIGS. 3a to 3d, in which an insulating layer 320 is deposited for insulation between the substrate 300 and the platinum film 306.

Merely as examples, FIGS. 3a to 3d and 4 illustrate methods depositing a platinum film in only two steps. However, the platinum film can also be deposited in three or more steps, according to other specific embodiments. When depositing in three or more steps, inert gas of argon alone is employed in the first step to form a platinum film of the first deposited thickness. Argon gas mixed with a nitrogen component is employed in the second step to deposit a platinum film of a second deposited thickness. A platinum film of a third deposited thickness can be deposited in the remaining steps by employing inert gas or a mixture of inert gas with a nitrogen component.

Description of Exemplary Integrated Circuit Devices

Figure 5A:
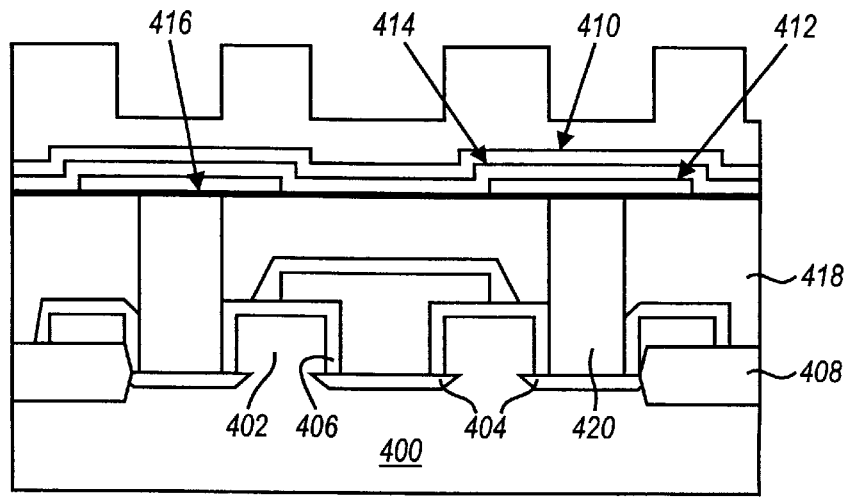
FIG. 5a is a schematic cross-sectional view of a high integration DRAM memory device, in accordance with a specific embodiment of the present invention.

FIG. 5a represents a schematic diagram of an exemplary integrated circuit device, such as a DRAM cell with high-dielectric capacitors, which may be fabricated in accordance with the present invention. As seen in FIG. 5a, formed in the DRAM cell region of a substrate 400 is a transistor having a gate electrode 402 and source/drain regions 404. Gate electrode 402, which may be formed with doped or undoped polysilicon, is capped with a sidewall oxide layer 406, and field oxide 408 provides isolation. Also formed in the DRAM cell region is a high-dielectric capacitor. The capacitor includes an upper capacitor cell plate 410, a bottom capacitor storage node 412, and a high dielectric constant material 414 formed between plate 410 and node 412. The capacitor is isolated from the transistor by an insulating layer 418, except through vias through layer 418 which are filled with a polysilicon plug layer 420. Insulating layer 418 may be made of $SiO_2$, BPSG, etc. A diffusion barrier layer 416 is formed between bottom capacitor storage node 412 and polysilicon plug 420. As discussed above, the present invention may be used to deposit orientation-controlled platinum for use as bottom capacitor storage node 412 and/or upper capacitor cell plate 410.

Figure 5B:
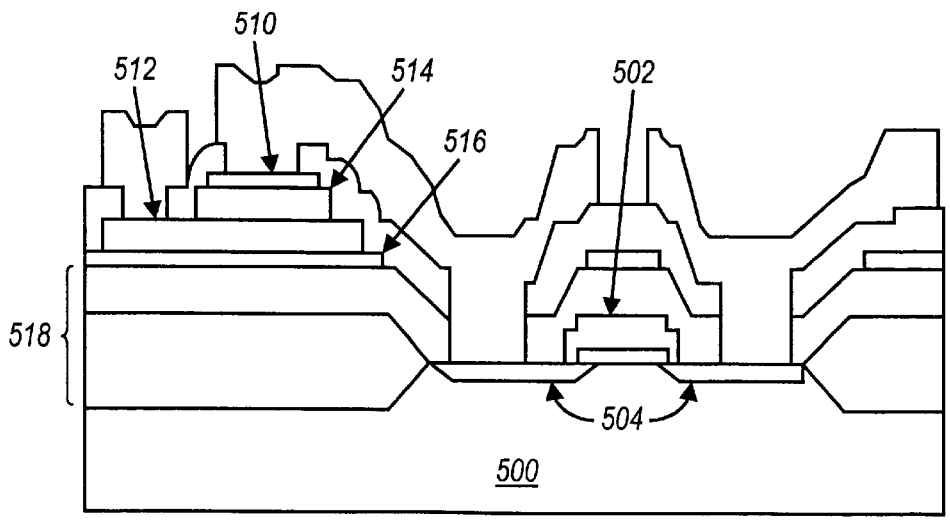
FIG. 5b is a schematic cross-sectional view of a non-volatile ferroelectric memory device, in accordance with another specific embodiment of the present invention.

FIG. 5b represents a schematic diagram of an exemplary integrated circuit device, such as a non-volatile ferroelectric memory device, which may also be fabricated in accordance with the present invention. As seen in FIG. 5b, formed in the cell region of a substrate 500 is a transistor having a gate electrode 502 and source/drain regions 504. Also formed in the non-volatile ferroelectric memory device is a ferroelectric capacitor. The capacitor includes a top capacitor electrode 510, a bottom capacitor electrode 512, and a ferroelectric material 514 (e.g., PZT) formed between electrodes 510 and 512. Formed underneath the bottom capacitor electrode 512 is a buffer layer 516 (e.g., $TiO_2$) formed over an insulating layer 518 on substrate 500. As discussed above, the present invention may be used to deposit orientation-controlled platinum for use as bottom electrode 512 and/or upper electrode 510.

FIGS. 5a and 5b are merely representative examples of integrated circuit devices which may be fabricated in accordance with specific embodiments of the present invention. Other devices also may be fabricated in accordance with other specific embodiments.

Description of Exemplary Substrate Processing Apparatus

In accordance with the present invention, the platinum film may be deposited by employing any one of the following methods: the DC/RF magnetron sputtering, DC/RF sputtering, metal organic chemical vapor deposition, partially ionized beam deposition, vacuum evaporation, laser ablation and electroplating.

Figure 6:
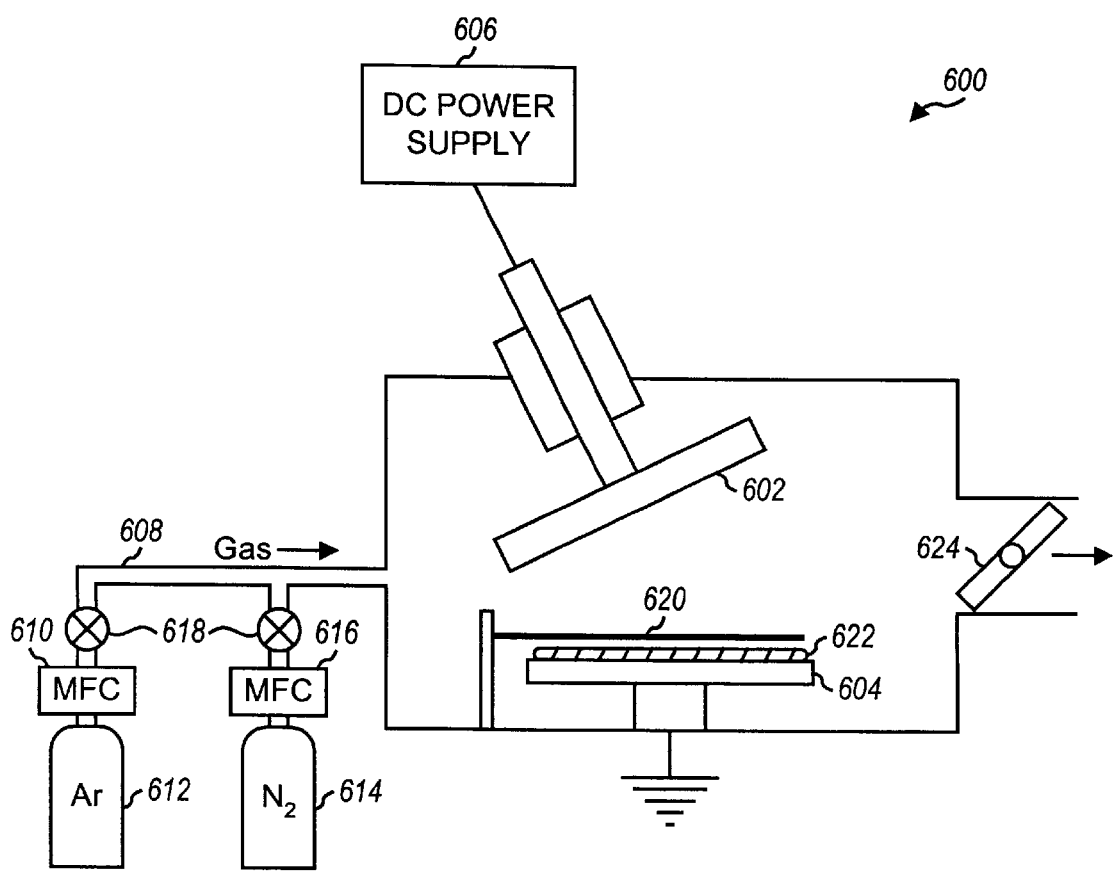
FIG. 6 is a simplified diagram illustrating an exemplary substrate processing apparatus which may be used in accordance with a specific embodiment of the present invention.

FIG. 6 is a simplified diagram illustrating an exemplary substrate processing apparatus, such as a DC sputtering apparatus 600, which may be used in accordance with a specific embodiment of the present invention. In the exemplary sputter deposition system of FIG. 6, a platinum target 602 (a plate of the platinum material that is to be deposited) is connected to a DC power supply 606 (alternatively, in a RF sputtering system, target 602 is connected to a RF power supply) at a negative voltage and 100 Watt to 200 Watt power while a substrate holder 604 facing target 602 is grounded (as seen in the specific embodiment of FIG. 6) or/and heated by a heater under substrate holder 604. In the specific embodiments, platinum target 602 may be a 2 inch, 4 inch or 6 inch diameter target for a 2 inch, 4 inch or 6 inch diameter substrate, respectively. In the specific embodiments discussed below, a 4 inch diameter was used for target 602 and the substrate. An inert gas, such as argon in the specific embodiment, is flowed through a gas line 608 at a rate controlled by a mass flow controller 610 into the system from an argon source 612. As mentioned earlier, an inert gas can be selected from Ar, Ne, Kr or Xe, in accordance with various specific embodiments. Nitrogen also is flowed from a nitrogen source 614 through gas line 608 at a rate controlled by a mass flow controller 616. In the specific embodiment, valves 618 are also used for inert gas source 612 and nitrogen source 614. In the specific embodiment, the system is typically maintained at a basic pressure on the order of about $10^{-6}$ Torr using an exhaust valve 624, to provide a medium in which a glow discharge can be initiated and maintained. When the glow discharge is started, positive ions strike target 602, and target platinum atoms are removed by momentum transfer. When a sliding shutter 620 is adjusted to expose substrate holder 604, these target platinum atoms subsequently condense into a thin platinum film on a substrate 622, which is on substrate holder 604. Target 602 and substrate holder 604 are tilted to each other by about 300 in the specific embodiment. Substrate holder 604 rotates during sputter deposition for obtaining uniform platinum film deposition over substrate 622 at a rotating speed of about 3 revolutions per minute, according to the specific embodiment. Prior to sputter deposition, substrate 622 was loaded using a magnetic bar into system 600 through a load lock chamber (not shown) coupled to the main chamber containing substrate holder 604. During sputter deposition, the total gas pressure within the main chamber of system 600 is controlled to a set value by exhaust valve 624, which is connected to a pumping system (not shown). Exhaust valve 624 also controls the flow of exhaust from system 600. It is noted that no auxiliary electrode is required with the exemplary sputtering deposition system 600 in order to deposit a preferred orientation-controlled platinum film onto substrate 622, which is a silicon substrate in the specific embodiment. For some embodiments, a magnetron gun may also be used to provide DC/RF magnetron sputtering.

Description of Exemplary Platinum Deposition Processes

Exemplary processing conditions and variables for sputter depositing preferred orientation-controlled platinum using an inert gas, such as argon in the specific embodiment, and nitrogen are described as follows. In controlling the preferred orientation of the deposited platinum film, four variables are important: (i) the substrate temperature ($T_s$) which is, more specifically for the specific embodiment, the temperature of the substrate surface during deposition; (ii) the nitrogen content in the gas ($F_{N2}$ (in %)=100×($N_2$ partial pressure/total gas pressure)); (iii) the total gas pressure ($P_{tot}$=inert gas partial pressure+$N_2$ partial pressure), which is, more specifically for the specific embodiment, the total gas pressure during film deposition; and (iv) the film deposition rate (DR (in Å/minute)=film thickness÷time spent in film deposition). These four variables determine many properties of the deposited platinum film, such as preferred orientation, hillock and/or pinhole formation, residual stress in the film, etc. In order to make orientation-controlled, defect-free platinum thin films, each of the four variables preferably should be controlled within some ranges, as discussed generally below.

Deposition conditions for preferred (200) orientation-controlled platinum films

FIGS. 7a to 7d illustrate the relationship between the degree (in %) of preferred (200) orientation in the deposited platinum film and variation of the above-discussed four deposition process variables. In particular, the degree of preferred (200) orientation in the deposited platinum film is defined as follows:

$$f_{(200)}=100\times[(I_{(200)})\div(I_{(111)}+I_{(200)}+I_{(220)}](\%).$$

where $I_{hkl}$ is the X-ray diffraction intensity of the (hkl) plane.

Figure 7A:
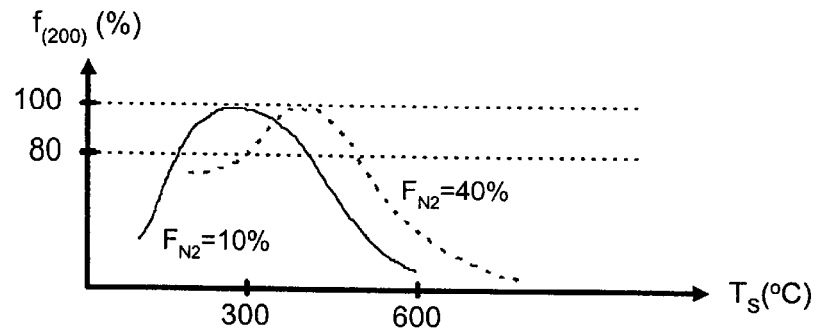
FIGS. 7a to 7d illustrate the relationship between the degree (in %) of preferred (200) orientation in the deposited platinum film and variation of four deposition process variables, according to a specific embodiment.

FIG. 7a illustrates the effect of changing the substrate temperature $T_s$ on the degree of preferred (200) orientation. For the data shown in FIG. 7a, $P_{tot}$=2 mTorr and DR=130 Å/min. With low nitrogen content ($F_{N2}$=10%), the range of $T_s$ for obtaining (200) orientation is lower than the range of the case with higher nitrogen content $F_{N2}$=40%), as shown in FIG. 7a. Close to 100% of preferred (200) orientation platinum film is obtained for $F_{N2}$=10% at a substrate temperature of about 300° C.; whereas, close to 100% of preferred (200) orientation platinum film is obtained for $F_{N2}$=40% at a substrate temperature of about 400° C.

Figure 7B:
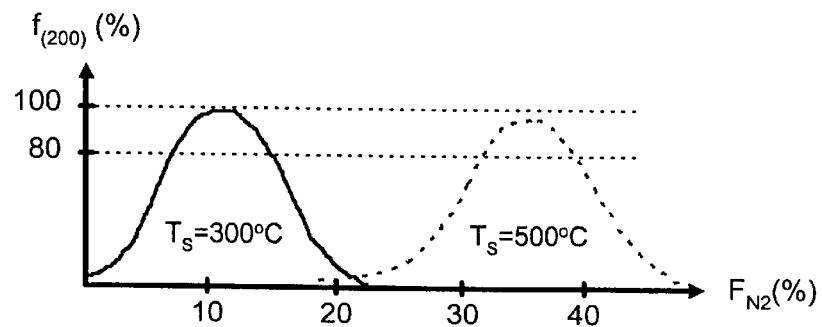

FIG. 7b illustrates the effect of changing the nitrogen content ($F_{N2}$) on the degree of the preferred (200) orientation. For the data shown in FIG. 7b, $P_{tot}$=2 mTorr and DR=130 Å/min. At a lower $T_s$ (300° C.), the range of nitrogen content for obtaining preferred (200) orientation is lower than that of the case at a higher $T_s$ (500° C.), as shown in FIG. 7b. Almost 100% of preferred (200) orientation platinum film is obtained for nitrogen content of about 10% when depositing at a substrate temperature of 300° C. In contrast, almost 100% of preferred (200) orientation platinum film is obtained for nitrogen content of about 35% when depositing at a substrate temperature of 500° C.

Figure 7C:
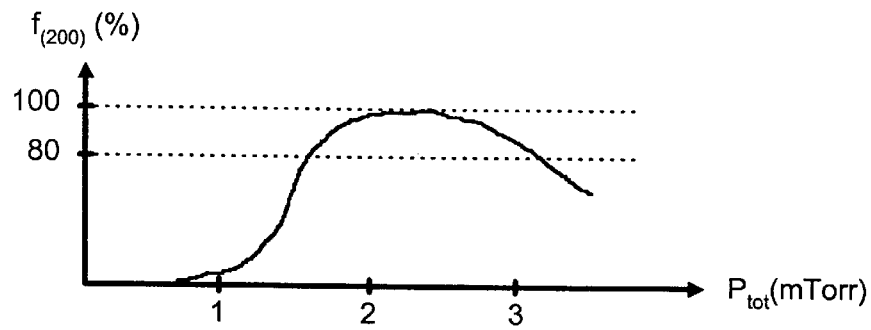

FIG. 7c illustrates the effect of changing the total gas pressure ($P_{tot}$) on the degree of the preferred (200) orientation. For the data shown in FIG. 7c, $FN_2$=20%, $T_s$=300° C., and DR=130 Å/min. As seen in FIG. 7c, total gas pressure should be in the range of about 1.5–3.0 mtorr in order to obtain close to 100% of preferred (200) orientation platinum film.

Figure 7D:
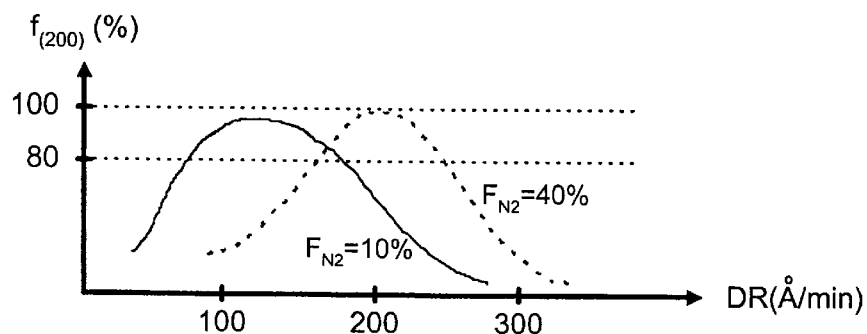

FIG. 7d illustrates the effect of deposition rate on the degree of the preferred (200) orientation. For the data shown in FIG. 7d, $P_{tot}$=2 mTorr and $T_s$=300° C. With low nitrogen content ($F_{N2}$=10%), the range of deposition rates for obtaining preferred (200) orientation platinum film is lower than the range of the case with higher nitrogen content ($F_{N2}$=40%), as shown in FIG. 7d. In particular, almost 100% of preferred (200) orientation platinum film is obtained for $FN_2$=10% at a deposition rate of about 100 Å/min; whereas, close to 100% of preferred (200) orientation platinum film is obtained for $F_{N2}$=40% at a deposition rate of about 200 Å/min.

From the above figures showing the relation between degree of preferred (200) orientation and the four deposition processing variables, preferred ranges for the deposition conditions in the argon and nitrogen deposition atmosphere were found to be as follows: $T_s$ of about 300° C. to about 500° C.; $F_{N2}$ of about 10–40%; $P_{tot}$ of about 1.5–3.0 mTorr; and DR of about 80–240 Å/min.

Deposition conditions for preferred (111) orientation-controlled platinum films

Similar experiments were performed in order to obtain preferred deposition conditions for the preferred (111) orientation-controlled platinum films, except using the degree of preferred (111) orientation in the deposited platinum film defined as follows:

$$f_{(111)}=100\times[(I_{(111)})\div(I_{(111)}+I_{(200)}+I_{(220)}](\%).$$

where $I_{hkl}$ is the X-ray diffraction intensity of the (hkl) plane. Platinum films having the preferred (111) orientation were deposited in experiments to determine preferred conditions. For preferred (111) orientation-controlled platinum films, the preferred ranges for the deposition conditions in the argon and nitrogen deposition atmosphere were found to be as follows: $T_s$ of about room temperature to about 200° C.; $F_{N2}$ of about 5–10%; $P_{tot}$ of about 1.0–1.3 mTorr; and DR of about 80–240 Å/min. Under these processing condition ranges, a preferred (111) orientation-controlled platinum film that was defect-free could be achieved. It was noted that the higher the substrate temperature, the higher the nitrogen content that is required. Further, it was seen that if $P_{tot}$ is too low and the nitrogen content is too high, many hillocks occur on the preferred (111) orientation-controlled platinum film. It was also seen that if $P_{tot}$ is too high and the nitrogen content is too low, many pinholes occur on the preferred (111) orientation-controlled platinum film.

It is noted that the values of these four process variables may not be universal (i.e., the value of a certain variable to achieve some property of the film may vary according to the specific substrate processing apparatus used). For example, these variables may vary depending on the geometrical factors of chamber volume, target-substrate distance and other properties, such as the magnetic field intensity of the magnetron gun if a magnetron sputtering apparatus is used.

Besides the importance of the four process variables during deposition, the annealing conditions are also important for obtaining preferred orientation-controlled and defect-free platinum films. In order to remove most of the nitrogen from the deposited platinum film, the annealing temperature range is preferably from about 400° C. to about 1000° C.

Experimental Results The advantages and effects of the present invention will now be explained in detail with reference to the examples which illustrate the procedures and conditions of tests performed. FIGS. 8a to 8f are graphs illustrating X-ray diffraction (XRD) patterns of platinum films deposited in accordance with examples 1 to 6. Typical Θ–2Θ scans of the platinum films using Cu $K_\alpha$ radiation in the X-ray diffractometer were performed to find the grains of the platinum films oriented with specific planes, as discussed below in the examples. FIGS. 8a to 8f show the XRD intensity in arbitrary units (a.u.) in relation to 2Θ (degrees).

EXAMPLE 1

An insulating layer of $SiO_2$ was formed on a silicon substrate. A platinum film was deposited on the top surface of the insulating layer under an atmosphere containing nitrogen component.

Deposition method: DC magnetron sputtering

Depositing atmosphere: Ar+N$_2$

Partial pressure ratio of nitrogen to the entire gas (argon+nitrogen): 10%

Depositing temperature of the substrate: room temperature

Annealing temperature and duration: 600° C. for one hour.

Figure 8A:
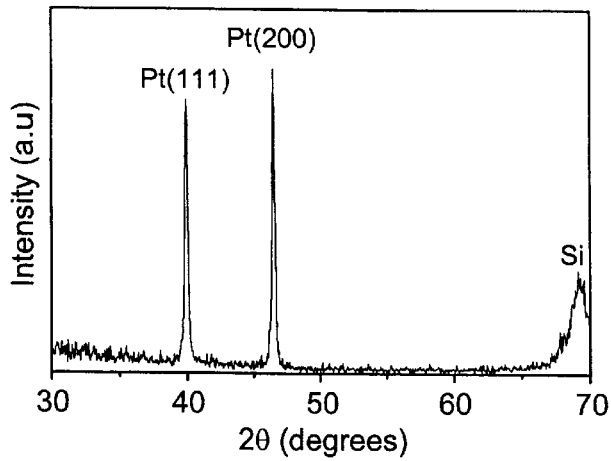
FIGS. 8a to 8f are graphs illustrating X-ray diffraction (XRD) patterns of platinum films deposited in accordance with examples 1 to 6.

The platinum film according to the conditions of Example 1 has a mixed (111) and (200) orientation as shown in FIG. 8a.

EXAMPLE 2

Figure 8B:
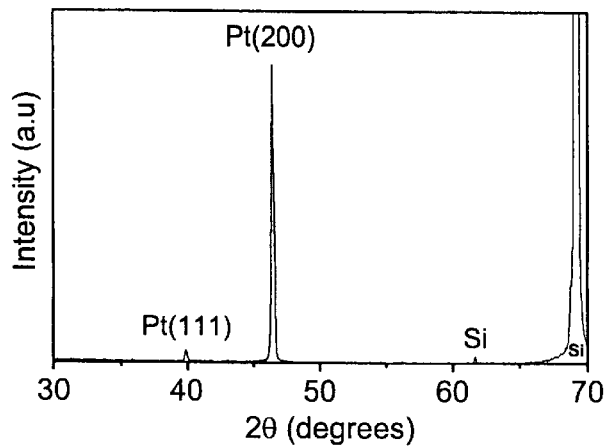

Deposition was performed under the same conditions as in the Example 1 except that the depositing temperature of the substrate was 300° C. The platinum film has a preferred (200) orientation as shown in FIG. 8b.

EXAMPLE 3

Figure 8C:
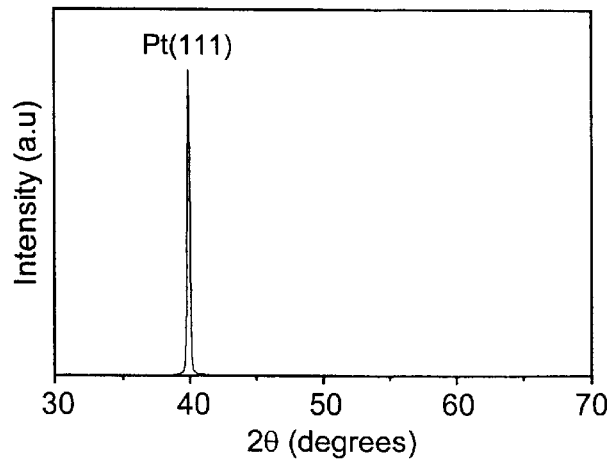

Deposition was performed under the same conditions as in the Example 1 except that the depositing temperature of the substrate was 500° C. The platinum film has a preferred (111) orientation as shown in FIG. 8c.

EXAMPLE 4

An insulating layer of SiO$_2$ was formed on a silicon substrate. Following this, a platinum film was formed on the top surface of the insulating layer under an atmosphere containing nitrogen.

Deposition method: DC magnetron sputtering

Depositing atmosphere: Ar+N$_2$

Partial pressure ratio of nitrogen against the entire gas: 5%

Depositing temperature of the substrate: 300° C.

Annealing temperature and duration: 650° C. for one hour

Figure 8D:
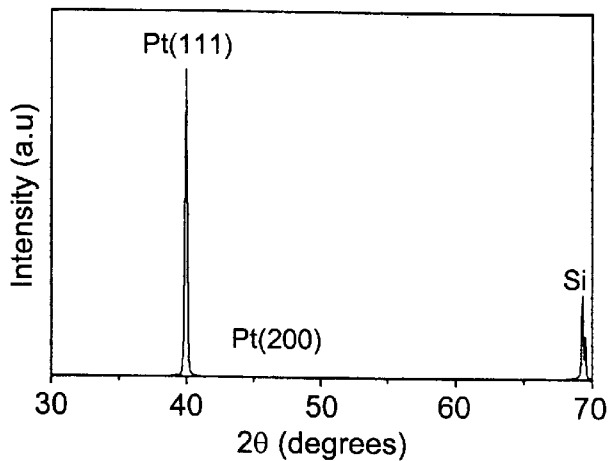

The platinum film deposited under the above conditions has a preferred (111) orientation as shown in FIG. 8d.

EXAMPLE 5

Figure 8E:
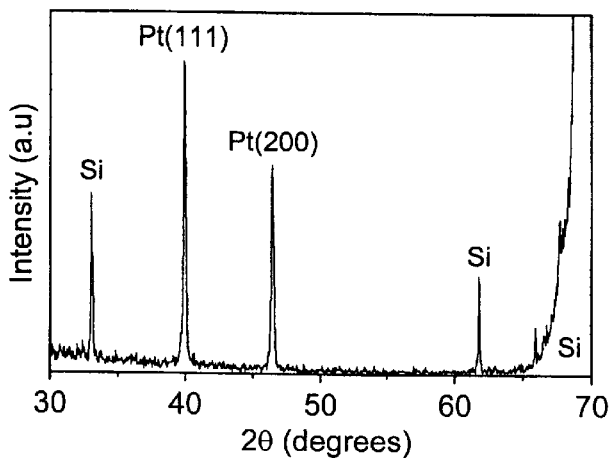

Deposition was performed under the same conditions as in the Example 4 except that the partial pressure ratio of the nitrogen to the entire depositing atmosphere is changed to 20%. The platinum film deposited under the above conditions is shown in FIG. 8e. The platinum film has a mixed orientation of (111) and (200).

EXAMPLE 6

An insulating layer of SiO$_2$ was formed on a silicon wafer, a platinum film of 2000 Å thickness was deposited on the insulating layer.

Deposition method: DC magnetron sputtering

Depositing atmosphere: Ar+N$_2$

Partial pressure of N$_2$ against the entire gas: 30%

Depositing temperature of the substrate: 300° C.

Depositing pressure: 1 mTorr

Annealing temperature and duration: 600° C. for one hour

Figure 8F:
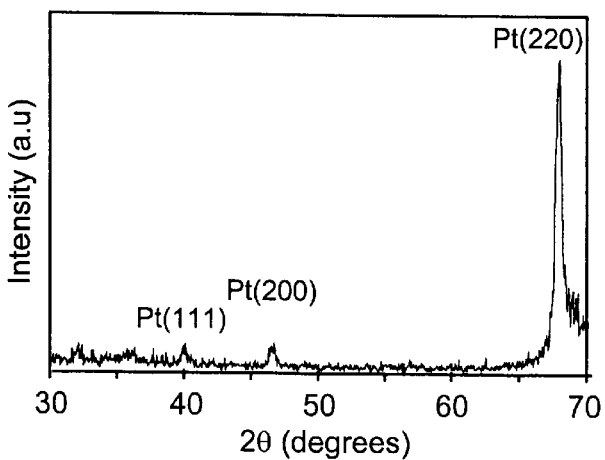

The platinum film formed in this example has a preferred (220) orientation as shown in FIG. 8f.

Figure 9A:
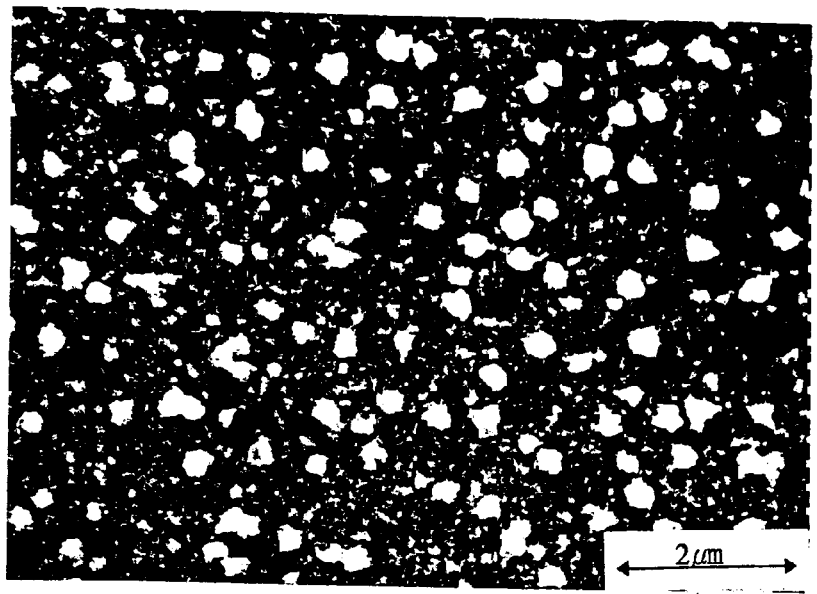
FIGS. 9a and 9b are scanning electron microscope micrographs showing a 10,000-times magnified planar view and a 50,000-times magnified cross-sectional view, respectively, of the platinum film deposited by a prior art method.
Figure 9B:
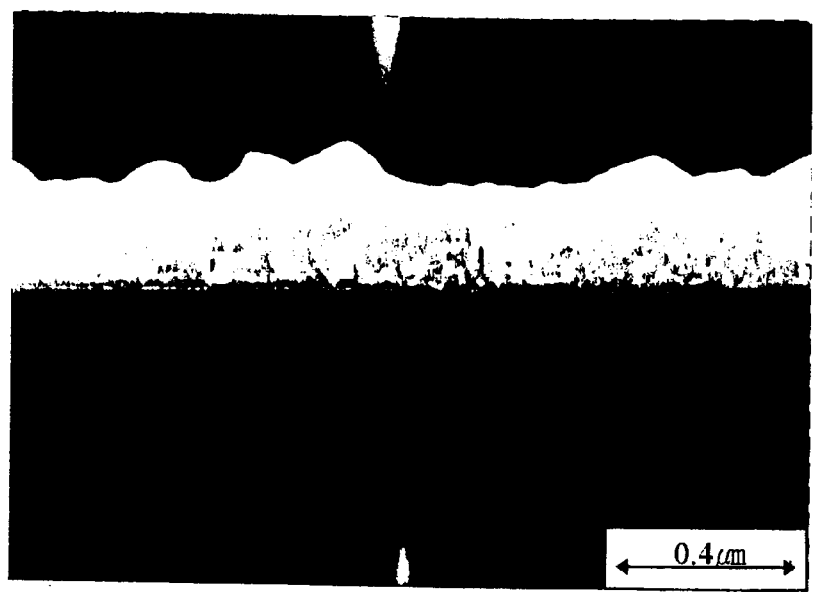
Figure 9C:
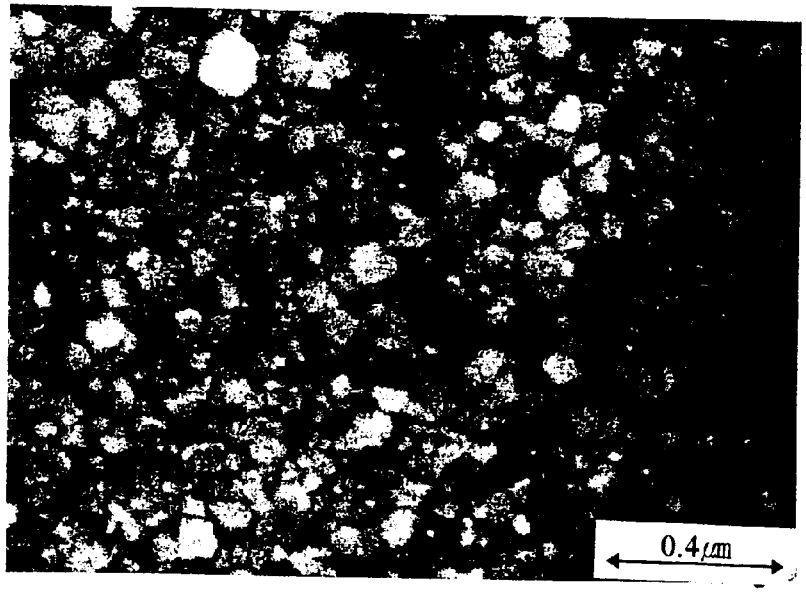
FIGS. 9c and 9d are scanning electron microscope micrographs showing 50,000-times magnified planar and cross-sectional views, respectively, of the platinum film deposited by Example 2 according to a specific embodiment of the present invention.
Figure 9D:
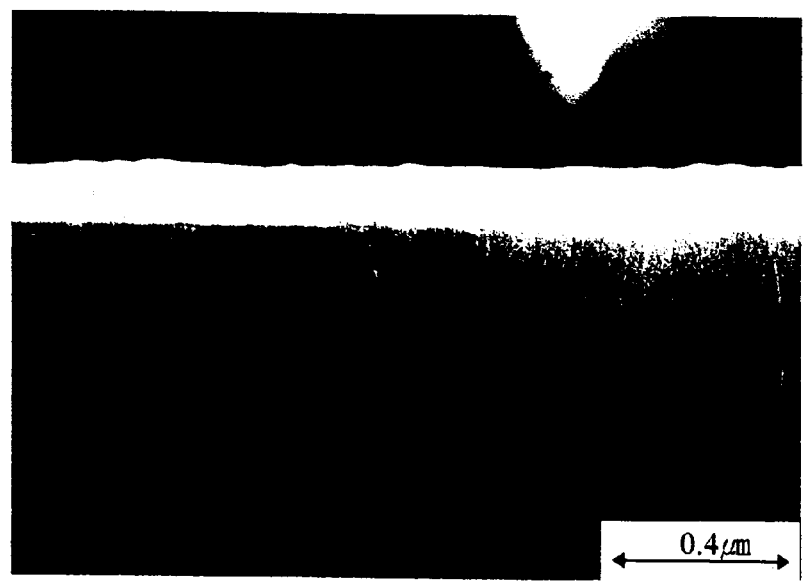

FIGS. 9a and 9b are scanning electron microscope micrographs showing a 10,000-times magnified planar view and a 50,000-times magnified cross-sectional view, respectively, of the platinum film deposited by a prior art method. In this prior art method, a platinum film is coated on a titanium glue layer deposited on a SiO2 substrate in an argon atmosphere, and then annealed for one hour at 600° C. The many white spots observed in FIG. 9a are hillocks or protrusions in the platinum film of the prior art. Moreover, it is clearly seen in the cross-sectional view of FIG. 9b that the platinum film of the prior art has a very rough surface as a result of these hillocks. FIGS. 9c and 9d are scanning electron microscope micrographs showing 50,000-times magnified planar and cross-sectional views, respectively, of the platinum film deposited by Example 2 according to the present invention. In contrast with the prior art platinum film, the platinum film of a specific embodiment of the present invention appears to be free of hillocks or other defects, as seen in FIG. 9c. Moreover, the cross-sectional view of FIG. 9d demonstrates that the surface of the platinum film is smooth. This example shows that the platinum film deposited by the present invention has no hillocks or any other defects.

The platinum film formed in the other Examples show the same results, which are not shown to avoid redundancy. This means that the platinum film formed according to the present invention is orientation-controllable, and has a dense structure showing no hillocks, pores or buckling, unlike the platinum film formed according to the prior art. The platinum films formed in accordance with the present invention show excellent electrical conductivity and the resistivities thereof are lower than 15 $\mu\Omega$-cm.

It is clear from the above description that preferred orientations of platinum films can be controlled by varying at least one of the following parameters: the partial pressure ratio of the nitrogen, depositing temperature of the substrate, and annealing conditions. Since orientation of the platinum film is controllable by any one of the following parameters: the partial pressure ratio of the nitrogen to the entire platinum deposition atmosphere, the temperature of the substrate, and annealing conditions; it is possible to form a platinum film having desired characteristics for a particular electronic device which uses the platinum film as a bottom electrode.

It should be understood that the above description is intended to be illustrative and not restrictive. Many embodiments will be apparent to those of skill in the art upon reviewing the above description. By way of example, the inventions herein have been illustrated primarily with regard to specific examples of platinum process recipes, but they are not so limited. Also, the annealing process performed after the platinum deposition may be performed in-situ, or in a different chamber from the deposition chamber. Those skilled in the art will recognize other equivalent or alternative methods of depositing the orientationcontrolled platinum layer while remaining within the scope of the claims of the present invention. The scope of the invention should, therefore, be determined not with reference to the above description, but should instead be determined with reference to the appended claims, along with the full scope of equivalents to which such claims are entitled.

What is claimed is:

1. A method of forming a platinum film on a silicon substrate of an integrated circuit comprising:

providing the silicon substrate;

heating the silicon substrate to a temperature;

depositing the platinum film on the silicon substrate under an atmosphere of an inert gas mixed with nitrogen to form a platinum film containing a nitrogen component;

annealing the platinum film containing the nitrogen component to obtain a platinum film substantially free of the nitrogen component; and controlling orientation of the platinum film on the substrate to (111), (200) or (220), or a combination thereof, by adjusting at least one of: the partial pressure ratio of the nitrogen to the entire depositing atmosphere gas, the temperature of the substrate, and the annealing conditions.

2. The method of claim 1, wherein the inert gas is selected from the group consisting of argon, neon, krypton, and xenon.

3. The method of claim 1, wherein the partial pressure ratio of the nitrogen to the entire depositing atmosphere gas is less than 50%.

4. The method of claim 1, wherein the substrate is heated to a temperature of about room temperature to about 500° C.

5. The method of claim 1, wherein the annealing temperature is about 400° C. to about 1,000° C.

6. The method of claim 1, wherein the deposition of platinum film is performed by DC/RF sputtering, DC/RF magnetron sputtering, metal organic chemical vapor deposition, partially ionized beam deposition, laser ablation deposition, or electroplating.

7. A method of fomiring a platinum film comprising:

providing a substrate;

forming a functional intermediate film on the substrate;

heating the substrate to a temperature;

depositing the platinum film on the intermediate layer under an atmosphere containing nitrogen and an inert gas, so that the platinum film contains nitrogen;

annealing the platinum film to substantially remove the nitrogen contained in the platinum film; and controlling orientation of the platinum film to (111), (200), or (220), or a combination thereof, by adjusting at least one of: the partial pressure ratio of the nitrogen to the entire gas in the deposition atmosphere, temperature of the substrate, and annealing conditions.

8. The method of claim 7, wherein the temperature of the substrate is heated to a temperature of about room temperature to about 500° C.

9. The method of claim 7, wherein the inert gas is selected from the group consisting of argon, neon, krypton and xenon.

10. The method of claim 7, wherein the partial pressure ratio of the nitrogen to the entire depositing atmosphere gas is less than 50%.

11. The method of claim 7, wherein the annealing temperature is about 400° C. to 1,000° C.

12. The method of claim 7, wherein the substrate is selected from the group consisting of:

single component semiconductors selected from the group consisting of Si, Ge and C;

compound semiconductors such as selected from the group consisting of GaAs, InP, Si/Ge and SiC;

single-crystalline ceramic such as selected from the group consisting of Sr $TiO_3$, $LaAlO_3$, $Al_2O_3$, KBr, NaCl, MgO, $ZrO_2$, $Si_3N_4$, $TiO_2$, $Ta_2O_5$ and AlN;

poly-crystalline ceramic such as selected from the group consisting of Si, $SrTiO_3$, $LaAlO_3$, $Al_2O_3$, MgO, KBr, NaCl, $ZrO_2$, $Si_3N_4$, $TiO_2$, $Ta_2O_5$ and AlN;

metals such as selected from the group consisting of Au, Ag, Al, Ir, Pt, Cu, Pd, Ru and W; and non-crystalline/glassy materials such as selected from the group consisting of BSG, PSG, BPSG and amorphous Si.

13. The method of claim 7, wherein the deposition of the platinum film is performed by DC/RF sputtering, DC/RF magnetron sputtering, metal organic chemical vapor deposition, vacuum evaporation, partially ionized beam deposition, laser ablation, or electroplating.

14. An electronic device having a bottom electrode comprising a platinum film fabricated in accordance with the method of claim 7.

15. The method of claim 7, further comprising:

forming a high-dielectric/ferroelectric film on the platinum film.

16. The method of claim 7, wherein the functional intermediate film is selected from the group consisting of an insulating layer, a conductive plug layer, an adhesion layer, and a diffusion barrier layer.

17. The method of claim 7, wherein the functional intermediate film is an insulating layer and is selected from the group consisting of $SiO_2$, $Si_3N_4$, BPSG, BSG, PSG, MgO, CaO, $CaF_2$, $Al_2O_3$, or $B_2O_3$.

18. The method of claim 7, wherein the functional intermediate film is a conductive plug and is selected from the group consisting of TiN, ZrN, TiSi, TaSi, WSi, MoSi, NiSi, CoSi, tantalum carbide, tantalum boride, polysilicon, germanium, W, Ta, Ti, Mo, TiW, boron carbide, and Cu.

19. The method of claim 7, wherein the functional intermediate film is a diffusion barrier layer and is formed from a material selected from the group consisting of ternary component amorphous materials (Ti—Si—N, Ta—B—N, Ti—B—N); and conductive nitride (titanium aluminum nitride, Zr nitride, Hf nitride, Y nitride, Se nitride, La nitride and rare earth nitride, N deficient Al nitride, doped Al nitride, Mg nitride, Ca nitride, Sr nitride, Ba nitride, TiN, GaN, Ni nitride, Ta nitride, Co nitride, and W nitride.

20. The method of claim 7, wherein the functional intermediate film is an adhesion layer and is formed from a material selected from the group comprising TiN, W, Ta, Ti, Sn, Ru, In, Ir, Os, Rh, and a silicide compound (Ni silicide, Co silicide, W silicide).

21. The method of claim 15, wherein the high-delectric or ferroelectric oxide film is selected from the group consisting of:

a perovskite structure oxide selected from the group consisting of BT($BaTiO_3$), BST($Ba_{1-x}Sr_xTiO_3$), ST($SrTiO_3$), PT($PbTiO_3$), PZT(Pb(Zr, Ti)$O_3$, PLT ($Pb_{1-x}La_xTiO_3$), PLZT($Pb_{1-x}La_x$)($Zr_yTi_z$)$_{1-x/4}O_3$, PMN ($PbMg_{1/3}Nb_{2/3}O_3$), $KNbO_3$, $LiTaO_3$, K(Ta, Nb)$O_3$, $CaTiO_3$, $SrSnO_3$, $NaNbO_3$, $LaAlO_3$, and $YAlO_3$;

a bismuth-layered perovskite structure oxide selected from the group consisting of $SrBiNbO_9$, $SrBi_2Ti_2O_9$, $SrBi_2Ta_2O_9$, $SrBi_2(Ta_xNb_{1-x})_2O_9$ and $Bi_4Ti_3O_{12}$; and a tungsten-bronze type structure oxide selected from the group consisting of $Sr_{1-x}Ba_xNb_2O_6$, (Sr, Ba)$_{0.4}R_xNa_{0.4}Nb_2O_6$(R; Cr, Zn, Y), (Pb, Ba)$Nb_2O_6$, (K, Sr)$Nb_2O_6$, (Pb, K)$Nb_2O_6$, $Pb_2KNb_5SO_{15}$, $K_3Li_2Nb_5O_{15}$, and (K, Na)$_3Li_2Nb_5O_{15}$, $K_2LiNb_5O_{15}$; $ReMnO_3$ (Re: rare-earth element); $BaMF_4$, (M: Mn, Co, Mg, Zn); and $KMgF_3$.

* * * * *